United States Patent
Hasegawa

(10) Patent No.: US 8,482,113 B2
(45) Date of Patent: Jul. 9, 2013

(54) SEMICONDUCTOR DEVICE

(75) Inventor: Hidenori Hasegawa, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 75 days.

(21) Appl. No.: 12/081,739

(22) Filed: Apr. 21, 2008

(65) Prior Publication Data

US 2008/0265412 A1 Oct. 30, 2008

(30) Foreign Application Priority Data

Apr. 27, 2007 (JP) ................................. 2007-119772

(51) Int. Cl.
*H01L 23/22* (2006.01)
*H01L 23/24* (2006.01)
(52) U.S. Cl.
USPC ........................................................ 257/687
(58) Field of Classification Search
USPC ......................................... 257/687, 778, 786
See application file for complete search history.

(56) References Cited

U.S. PATENT DOCUMENTS

| 7,420,128 B2* | 9/2008 | Sunohara et al. ............. 174/260 |
| 2002/0117743 A1* | 8/2002 | Nakatani et al. .............. 257/687 |
| 2005/0001331 A1* | 1/2005 | Kojima et al. ................ 257/778 |
| 2009/0020882 A1* | 1/2009 | Hasegawa ..................... 257/773 |

FOREIGN PATENT DOCUMENTS

| JP | 11168150 | 6/1999 |
| JP | 2002158312 | 5/2002 |
| JP | 2003-31955 | 1/2003 |
| JP | 2003249604 | 9/2003 |
| JP | 2005235824 | 9/2005 |
| JP | 2006-41401 | 2/2006 |
| JP | 2006-269804 | 10/2006 |
| JP | 2007-27526 | 2/2007 |
| JP | 2007-294634 | 11/2007 |

* cited by examiner

*Primary Examiner* — Jenny L Wagner
(74) *Attorney, Agent, or Firm* — Rabin & Berdo, P.C.

(57) ABSTRACT

A package substrate has wires that electrically connect to a semiconductor chip, and surface side terminals that are solid and cylindrical and ends of which are electrically connected to the wires. The semiconductor chip is sealed by a sealing resin layer that is formed by molding a sealing resin so as to cover the semiconductor chip. A surface of the sealing resin layer is made to have a height that is the same as that of end surfaces of other ends of the surface side terminals by grinding. Thus, the surface of the sealing resin layer is a ground surface that is a rough surface and is formed by grinding. The end surfaces of the surface side terminals are exposed at the ground surface of the sealing resin layer.

3 Claims, 10 Drawing Sheets

SEMICONDUCTOR DEVICE

CROSS-REFERENCE TO RELATED APPLICATION

This application claims priority under 35 USC 119 from Japanese Patent Application No. 2007-119772, the disclosure of which is incorporated by reference herein.

BACKGROUND OF THE INVENTION

1. Field of the Invention

The present invention relates to a semiconductor device and a method of manufacturing thereof, and in particular, relates to a semiconductor device of a double-sided electrode structure and a method of manufacturing thereof.

2. Description of the Related Art

Recently, due to electronic devices such as cell phones and the like being made more compact, developments in three-dimensional packaging techniques which have higher packaging densities have advanced. Among these three-dimensional packaging techniques, a method called package-on-package (POP), in which a package is layered on another one package, is promising. A package of a double-sided electrode structure (a double-sided electrode package) is used in POP. A double-sided electrode package requires an internal wire connected to a semiconductor chip, a through electrode connecting the internal wire and an electrode at the package surface side, and a through electrode connecting the internal wire and an electrode at the package reverse side.

Double-sided electrode packages of various structures have conventionally been proposed. For example, Japanese Patent Application Laid-Open (JP-A) No. 2002-158312 discloses a resin-sealed type double-sided electrode package. In this double-sided electrode package, a through electrode is provided at a sealing resin layer that seals a semiconductor chip, and a surface side electrode and an internal wire are connected via this through electrode.

Further, a lead frame type double-sided electrode package is disclosed in JP-A No. 2003-249604. In this package, a portion of an internal lead is exposed at the exterior of a resin sealing material, and the surface and the reverse of the internal lead are made to be external electrodes. Here, the internal lead functions as a through electrode.

Moreover, a ball grid array (BGA) type double-sided electrode package is disclosed in JP-A No. 2005-235824. In this package, a stepped portion is provided at a package substrate. The end portion of an electrode for wire bonding is exposed at the stepped portion. This end portion and a surface side or reverse side electrode are connected by a through electrode which passes-through the package substrate.

In order to mount these double-sided electrode packages at a high density, the individual packages must be made to be thin. For example, in JP-A No. 2005-235824, the package is made to be thin by providing the stepped portion at the package substrate and mechanically grinding the package substrate from the reverse side.

However, in the structures of conventional double-sided electrode packages, the surface side electrode is not disposed in an arbitrary layout, and adaptability in connecting the top and bottom packages is lacking. Further, the sealing resin layer is formed by a transfer method, but in a transfer method, molding is carried out by using a mold, and it is therefore difficult to form the sealing resin layer to be thin.

SUMMARY OF THE INVENTION

The present invention has been developed in view of the aforementioned, and an object thereof is to enable a double-sided electrode package, at which connection with a package layered on the upper side thereof is easy, to be manufactured thinly and simply.

The semiconductor device of the present invention includes:

a package substrate on a surface of which is formed an electrode pad that is electrically connected to an electrode of a semiconductor chip, and on an opposite surface of which is formed an external connection pad that is electrically connected to the electrode pad;

the semiconductor chip placed at the surface of the package substrate, the electrode of the semiconductor chip being electrically connected to the electrode pad;

a sealing resin layer having a ground surface that is parallel to the surface of the package substrate and is formed by grinding, the sealing resin layer sealing the semiconductor chip by a sealing resin; and a surface side terminal that is columnar and is formed so as to pass through the sealing resin layer, one end of the surface side terminal being electrically connected to the electrode pad, and another end of the surface side terminal being exposed at a surface of the sealing resin layer.

In the above-described semiconductor device, it is preferable that a concave portion be formed at the other end of the surface side terminal.

The above-described semiconductor device can be manufactured by the following manufacturing method. Namely, the method of manufacturing a semiconductor device includes:

forming, per package and at a frame substrate which is divided into a plurality of package substrates, an electrode pad, that is electrically connected to an electrode of a semiconductor chip, on a surface of the package substrate, and an external connection pad, that is electrically connected to the electrode pad, on a reverse of the package substrate, and a surface side terminal that is columnar and whose one end is electrically connected to the electrode pad and at other end of which a concave portion is formed;

per package, placing the semiconductor chip on the surface of the package substrate, and electrically connecting the electrode to the electrode pad;

molding a sealing resin so as to fill-in gaps between the concave portions and the semiconductor chips and so as to cover the surfaces of the plurality of package substrates and the surface side terminals, in order to seal the semiconductor chips by the sealing resin;

forming a ground surface that is parallel to the surfaces of the package substrates by grinding the molded sealing resin until other ends of the surface side terminals are exposed; and dicing the frame substrate at which the semiconductor chip is placed per package and the electrode pad, the external connection pad, the surface side terminal and the sealing resin are respectively formed per package, so as to divide the frame substrate into individual packages.

The semiconductor device of the present invention may further include a rewiring pad formed at the ground surface of the sealing resin layer; and a connection wire formed at the ground surface of the sealing resin layer, and electrically connecting the other end of the surface side terminal and the rewiring pad.

A semiconductor device that further includes the rewiring pad and the connection wire can be manufactured by the following manufacturing method. Namely, the method of manufacturing a semiconductor device includes:

forming, per package and at a frame substrate which is divided into a plurality of package substrates, an electrode pad, that is electrically connected to an electrode of a semiconductor chip, on a surface of the package substrate, and an external connection pad, that is electrically connected to the electrode pad, on a reverse of the package substrate, and a surface side terminal that is columnar and whose one end is electrically connected to the electrode pad and at other end of which a concave portion is formed;

per package, placing the semiconductor chip on the surface of the package substrate, and electrically connecting the electrode to the electrode pad;

molding a sealing resin so as to fill-in gaps between the concave portions and the semiconductor chips and so as to cover the surfaces of the plurality of package substrates and the surface side terminals, in order to seal the semiconductor chips by the sealing resin;

forming a ground surface that is parallel to the surfaces of the package substrates by grinding the molded sealing resin until other ends of the surface side terminals are exposed; and on the ground surface and per package, forming a rewiring pad and forming a connection wire that electrically connects the rewiring pad and the other end of the surface side terminal; and dicing the frame substrate at which the semiconductor chip is placed per package and the electrode pad, the external connection pad, the surface side terminal, the sealing resin, the rewiring pad and the connection wire are respectively formed per package, so as to divide the frame substrate into individual packages.

In accordance with the present invention, there is the effect that a double-sided electrode package, at which connection with a package layered on the upper side thereof is easy, can be manufactured thinly and simply.

BRIEF DESCRIPTION OF THE DRAWINGS

Preferred exemplary embodiments of the present invention will be described in detail based on the following figures, wherein.

DETAILED DESCRIPTION OF THE INVENTION

Examples of exemplary embodiments of the present invention will be described in detail hereinafter with reference to the drawings.

First Exemplary Embodiment (Double-Sided Electrode Package)

Figure 1A:
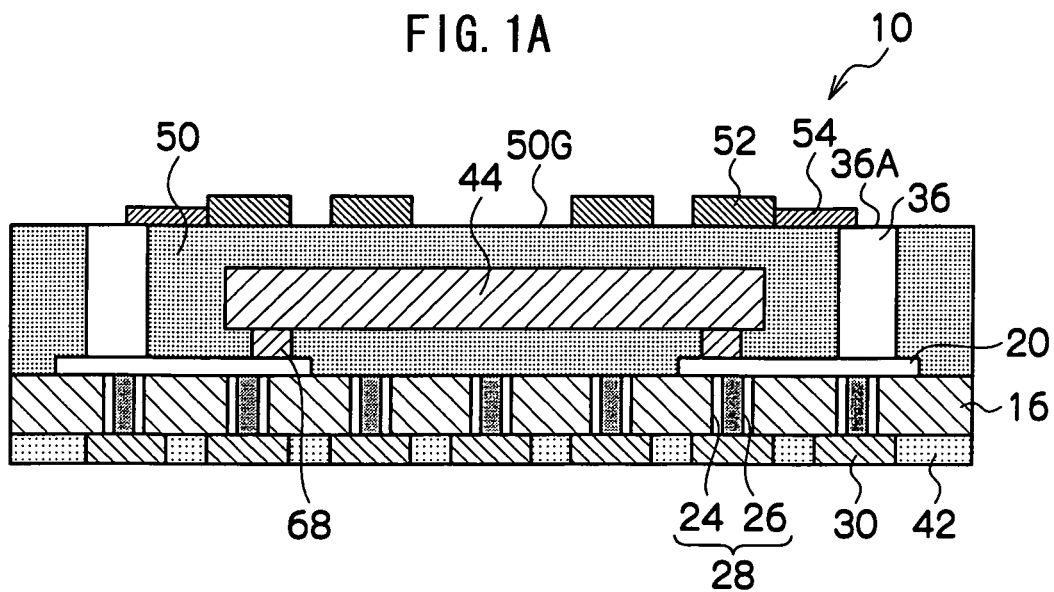
FIG. 1A is a schematic sectional view showing the structure of a double-sided electrode package relating to a first exemplary embodiment of the present invention.
Figure 1B:
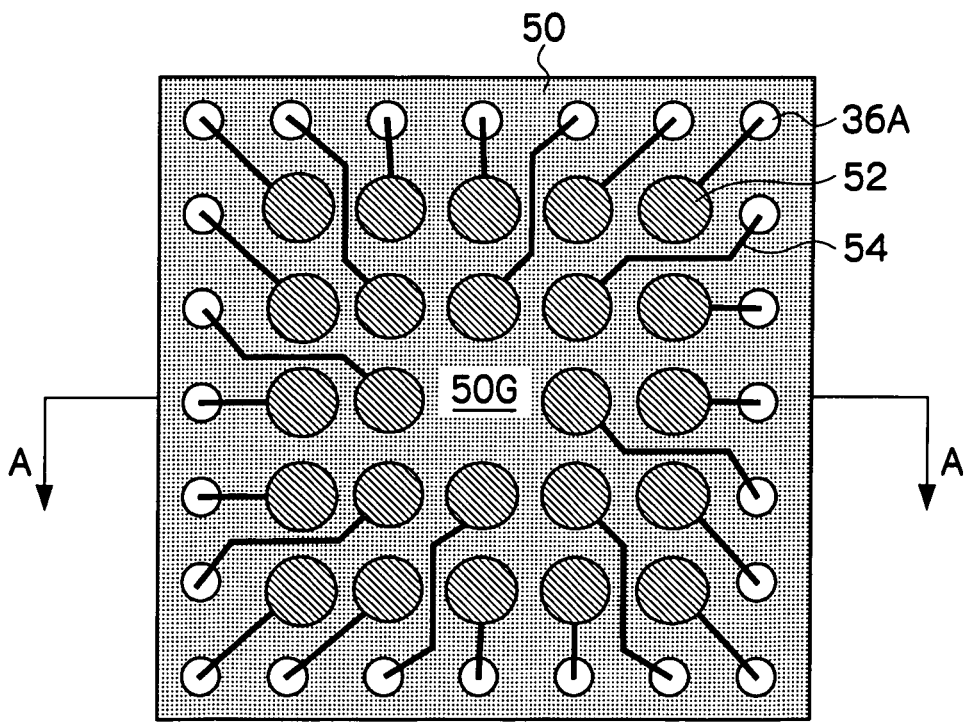
FIG. 1B is a plan view viewing the double-sided electrode package from a surface side.

FIG. 1A is a schematic sectional view showing the structure of a double-sided electrode package relating to a first exemplary embodiment of the present invention. FIG. 1B is a plan view viewing the double-sided electrode package from the surface side. FIG. 1A is the A-A sectional view of FIG. 1B.

A double-sided electrode package 10 relating to the first exemplary embodiment has a flat-plate-shaped core material 16 which is structured by an insulator such as a resin or a ceramic or the like. Wires 20 are formed in a predetermined pattern at the surface of the core material 16. End portions of the wires 20 are bonding pads for connecting a semiconductor chip 44 such as an LSI chip or the like. Plural vias 24, which pass through the core material 16, are formed in the core material 16. An electrically conductive material 26 is filled in the respective vias 24 so as to form through electrodes 28.

One end of the through electrode 28 is exposed at the surface of the core material 16, and the other end of the through electrode 28 is exposed at the reverse of the core material 16. Plural electrode pads 30 for external connection are formed at the reverse of the core material 16, so as to cover the exposed portions of the through electrodes 28. Further, the one ends of the through electrodes 28 which are exposed at the surface of the core material 16 are electrically connected to the wires 20, and the other ends of the through electrodes 28 which are exposed at the reverse of the core material 16 are electrically connected to the electrode pads 30. Moreover, the reverse of the core material 16 is covered by a solder resist 42, but with the electrode pads 30 left uncovered.

Plural surface side terminals 36, which are shaped as solid cylinders, are formed at the surface of the core material 16 so as to quadrangularly surround a chip placement region 14 (the region surrounded by the dotted line in FIG. 2) at which the semiconductor chip 44 is disposed. The surface side terminals 36 are formed of an electrically conductive material. The chip placement region 14 is rectangular in plan view, and the size thereof is larger than the planar size of the semiconductor chip 44. The surface side terminals 36 stand on the wires 20, substantially perpendicular with respect to the surface of the core material 16. The height of the surface side terminals 36 is about 0.1 to 0.3 mm. The thickness of the semiconductor chip 44 is generally about 50 to 100 μm. The height of the surface side terminals 36 is preferably made to be about two to three times the thickness of the semiconductor chip 44. Further, one ends of the surface side terminals 36 are electrically connected to the wires 20.

Figure 2A:
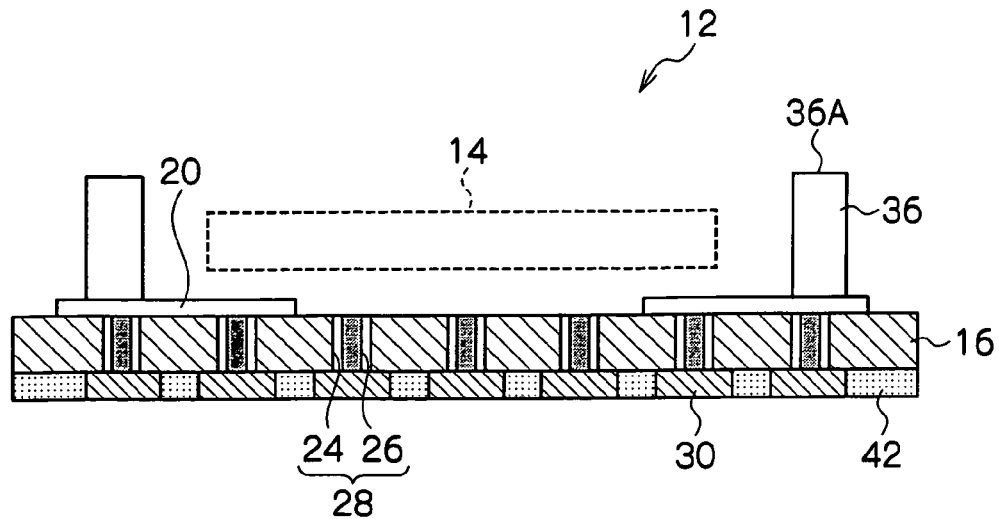
FIG. 2A is a cross-sectional view of a package substrate.
Figure 2B:
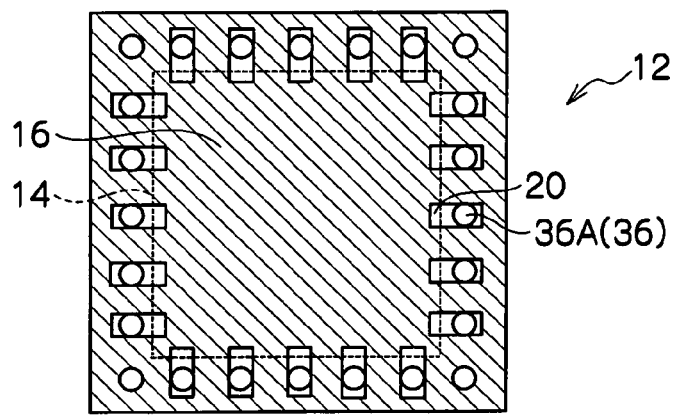
FIG. 2B is a plan view viewing the package substrate from the surface side.
Figure 2C:
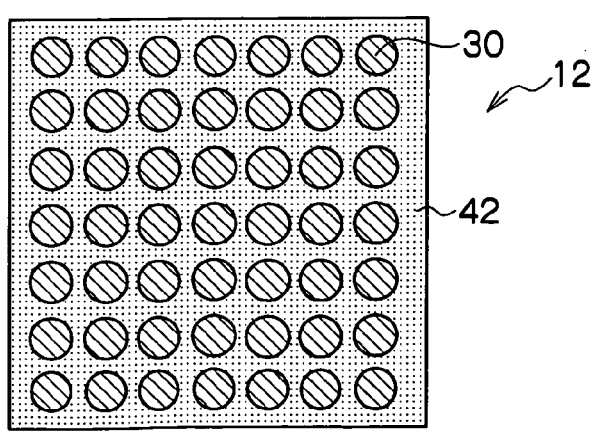
FIG. 2C is a plan view viewing the package substrate from the reverse side.

As shown in FIG. 2A, the core material 16, at which the wires 20, the through electrodes 28, the electrode pads 30, the surface side terminals 36 and the solder resist 42 are formed, is a package substrate 12. FIG. 2B is a plan view viewing the package substrate 12 from the surface side, and FIG. 2C is a plan view viewing the package substrate 12 from the reverse side. In the present exemplary embodiment, 24 of the surface side terminals 36 are formed for one semiconductor chip 44 at the periphery of the chip placement region 14. Further, in the present exemplary embodiment, 49 of the electrode pads 30 are formed on the reverse of the package substrate 12. Note that the number of the surface side terminals 36 and the number of the electrode pads 30 can be changed appropriately in accordance with the number of electrodes of the semiconductor chip 44 or the like.

The semiconductor chip 44, which is an LSI chip or the like, is disposed face-down on the chip placement region 14. Electrodes (not shown) that are formed on the surface of the semiconductor chip 44 are directly connected to the wires 20 by metal bumps 68 of solder or the like. Namely, the semiconductor chip 44 is flip-chip connected to the package substrate 12.

The semiconductor chip 44 is sealed by a sealing resin 50. Similarly, the wires 20 and the bumps 68 as well are sealed by the sealing resin 50. Due to the resin layer, which is formed by molding so as to cover the semiconductor chip 44, being ground from the surface as will be described later, the surface of the sealing resin 50 is made to be the same height as (the same surface as) end surfaces 36A of the other ends of the surface side terminals 36. The surface of the sealing resin 50 is a ground surface 50G which is formed by grinding. As shown in FIG. 1B, the plural end surfaces 36A are exposed from the ground surface 50G.

Plural rewiring pads 52 are formed on the ground surface 50G of the sealing resin 50. In the present exemplary embodiment, as shown in FIG. 1B, 24 of the rewiring pads 52 are disposed in the form of a 5×5 matrix except for one at the center. Note that the number of the rewiring pads 52 can be changed appropriately in accordance with the number of the surface side terminals 36 or the like.

As described above, in the present exemplary embodiment, 24 of the surface side terminals 36 are formed at the periphery of the chip placement region 14, and the 24 end surfaces 36A are exposed from the ground surface 50G. Wires 54, which connect the end surfaces 36A of the surface side terminals 36 and the rewiring pads 52 in a one-to-one correspondence, are formed, and rewiring is carried out at the surface of the double-sided electrode package 10.

(Method of Manufacturing Double-Sided Electrode Package)

A manufacturing method of manufacturing the above-described double-sided electrode package 10 will be described next. FIG. 3 through FIG. 8 are drawings showing processes of manufacturing the double-sided electrode package 10 relating to the first exemplary embodiment. As shown in FIG. 3 through FIG. 8, a single substrate frame 60, at which a plurality of the package substrates 12 are formed, is used in these manufacturing processes. The structure of the double-sided electrode package is formed on the substrate frame 60 for each of the package substrates. Finally, by dicing the substrate frame 60, the substrate frame 60 is separated into the individual double-sided electrode packages. Hereinafter, the processes of manufacturing the double-sided electrode package 10 will be described in order.

(Substrate Frame Preparing Process)

First, a single substrate frame at which plural package substrates are formed is readied.

Figure 3A:
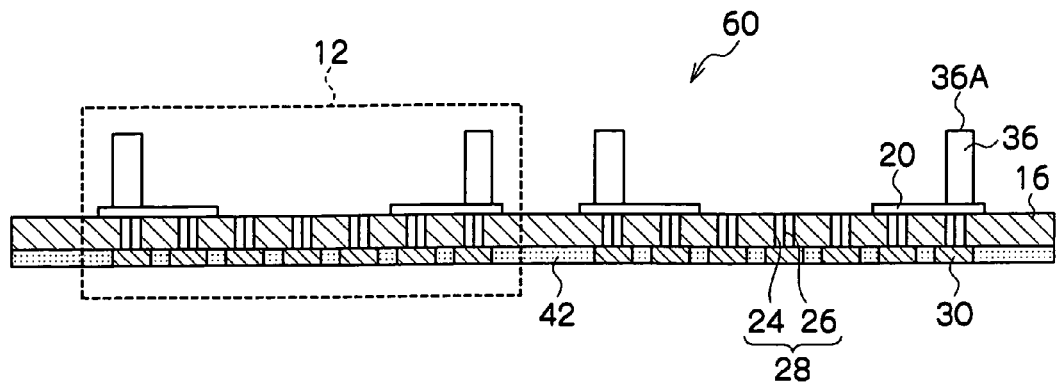
FIG. 3A is a partial sectional view of a substrate frame, and shows a substrate frame preparing process.
Figure 3B:
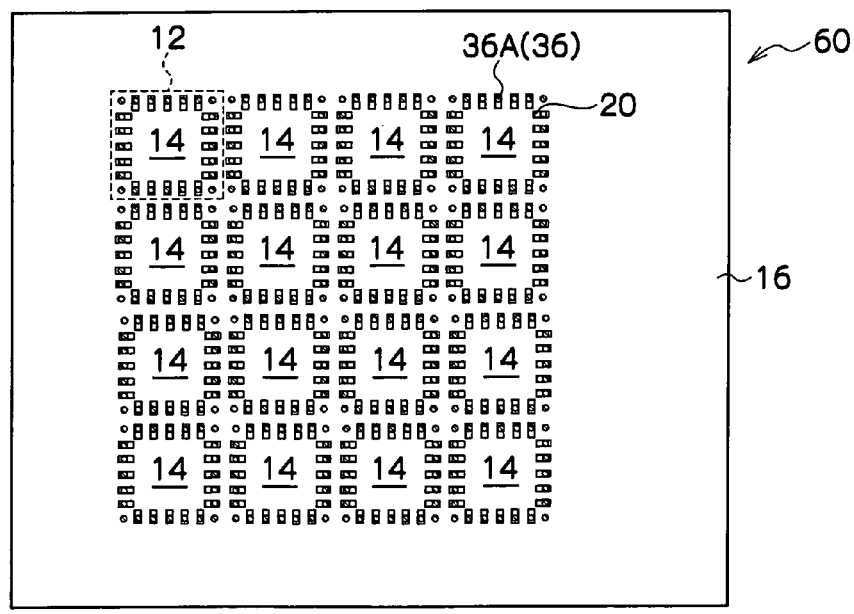
FIG. 3B is a plan view viewing the substrate frame from the surface side, and shows the substrate frame preparing process.

FIGS. 3A and 3B are drawings showing the substrate frame preparing process. FIG. 3A is a partial sectional view of the substrate frame, and FIG. 3B is a plan view viewing the substrate frame from the surface side.

A plurality of the package substrates 12 are formed at the substrate frame 60. Here, as shown in FIG. 3B, a portion of the substrate frame 60 is illustrated. Sixteen package substrates 12 are disposed in a 4×4 matrix form at the illustrated portion of the substrate frame 60. Note that FIG. 3A shows only a portion that includes two of the package substrates 12. The portion surrounded by the dotted line corresponds to the one package substrate 12 illustrated in FIGS. 2A through 2C.

The substrate frame 60 is provided with the flat-plate-shaped core material 16, and the wires 20, the through electrodes 28, the electrode pads 30, the surface side terminals 36 and the solder resist 42 which are formed at the core material 16. The plural surface side terminals 36 are disposed quadrangularly so as to surround the chip placement region 14 of each package substrate 12. In other words, the chip placement region 14 is formed by disposing the plural surface side terminals 36 in the form of a frame. In the example shown in FIG. 3B, 16 of the chip placement regions 14 are formed at the substrate frame 60.

The core material 16 and the solder resist 42 are preferably structured by organic resins. Further, the electrically-conductive members, such as the electrically-conductive material 26 filled in the vias 24 of the through electrodes 28, the electrode pads 30, the surface side terminals 36, and the like are preferably structured by conductors having low electric resistance such as copper (Cu) or the like.

(Semiconductor Chip Placement Process)

Figure 4A:
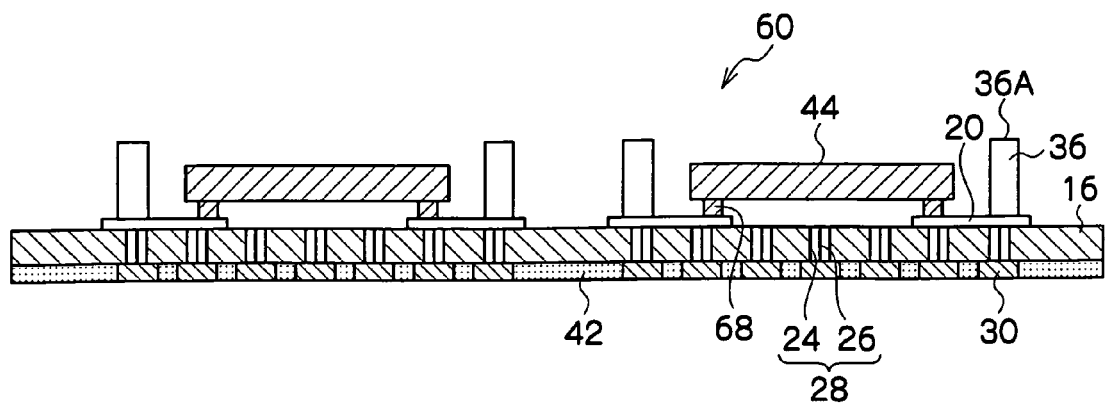
FIG. 4A is a partial sectional view of the substrate frame, and shows a semiconductor chip placement process.
Figure 4B:
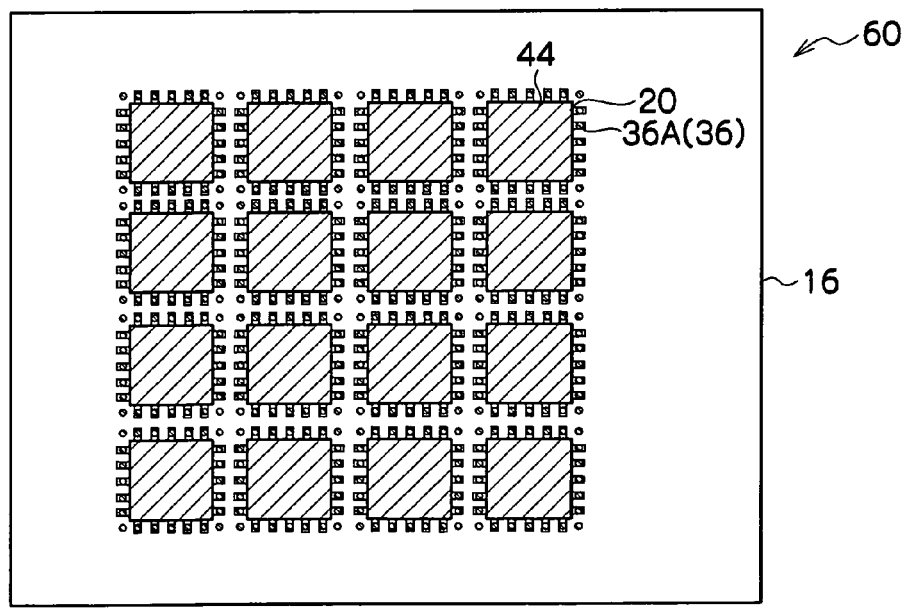
FIG. 4B is a plan view viewing the substrate frame from the surface side, and shows the semiconductor chip placement process.

Next, the semiconductor chips 44 are placed at the chip placement regions 14 of the individual package substrates 12. FIGS. 4A and 4B are drawings showing the semiconductor chip placement process. FIG. 4A is a partial sectional view of the substrate frame, and FIG. 4B is a plan view viewing the substrate frame from the surface side. The semiconductor chips 44, such as IC chips or LSI chips or the like, are fabricated by separating (dicing) a semiconductor wafer, at which a plurality of the same circuits are formed, into the individual circuits. Although not illustrated, plural electrodes are provided on the surfaces of the semiconductor chips 44.

The semiconductor chips 44 are placed face-down on the chip placement regions 14 of the package substrates 12. The electrodes (not shown) that are formed on the surfaces of the semiconductor chips 44 are directly connected to the wires 20 by the bumps 68. In this way, the semiconductor chips 44 are flip-chip connected to the package substrates 12. In the same way, the semiconductor chips 44 are fixed to the respective chip placement regions 14 of the substrate frame 60.

(Semiconductor Chip Sealing Process)

Next, the semiconductor chips 44 are sealed by sealing resin.

Figure 5A:
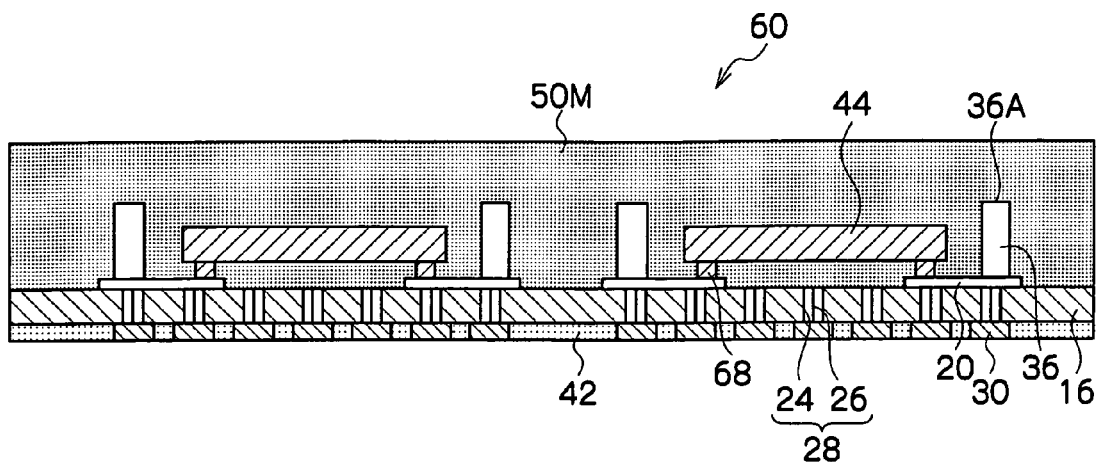
FIG. 5A is a partial sectional view of the substrate frame, and shows a semiconductor chip sealing process.
Figure 5B:
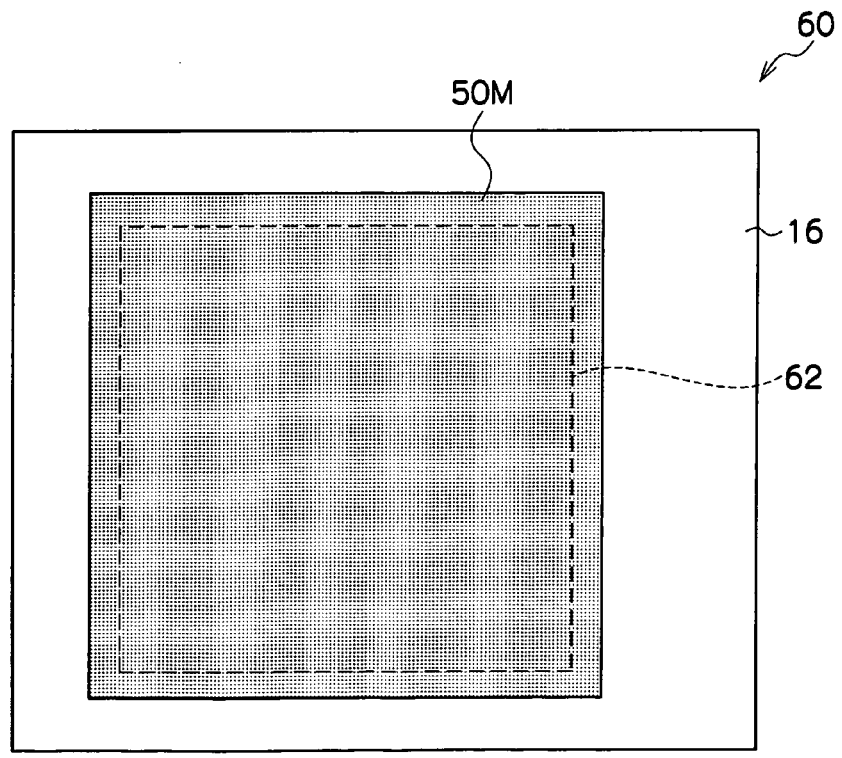
FIG. 5B is a plan view viewing the substrate frame from the surface side, and shows the semiconductor chip sealing process.

FIGS. 5A and 5B are drawings showing the semiconductor chip sealing process. FIG. 5A is a partial sectional view of the substrate frame, and FIG. 5B is a plan view viewing the substrate frame from the surface side.

The sealing by the sealing resin is carried out by a transfer method in which the substrate frame 60, at which the semiconductor chips 44 are disposed at the respective chip placement regions 14, is set in an unillustrated molding mold. By injecting and filling sealing resin into the molding mold, the surface of the substrate frame 60 is covered by a sealing resin 50M.

The sealing resin 50M covers a wider range than a region 62 (shown by the dotted line) at which the plural package substrates 12 are formed. An epoxy resin can be used as the sealing resin. The sealing resin is filled so as to fill-in the gaps between the semiconductor chips 44 and the substrate frame 60. Further, the surface of the substrate frame 60 is covered by the sealing resin 50M such that the surface side terminals 36 are covered by the sealing resin 50M.

After molding is ended, the substrate frame 60 is removed from the molding mold, and the sealing process ends. By covering the surface of the substrate frame 60 by the sealing resin 50M, the semiconductor chips 44 as well as the wires 20 and the bumps 68 also are sealed simultaneously. Further, by covering a range which is wider than the region 62 by the sealing resin 50M, the semiconductor chips 44 disposed at the respective chip placement regions 14 are sealed collectively.
(Sealing Resin Grinding Process)

Next, the sealing resin 50M is ground from the surface side.

Figure 6A:
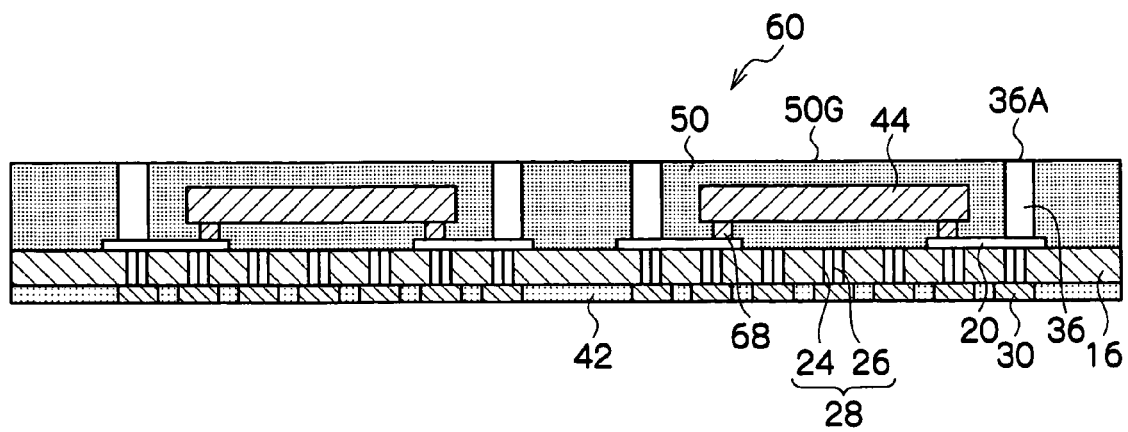
FIG. 6A is a partial sectional view of the substrate frame, and shows a sealing resin grinding process.
Figure 6B:
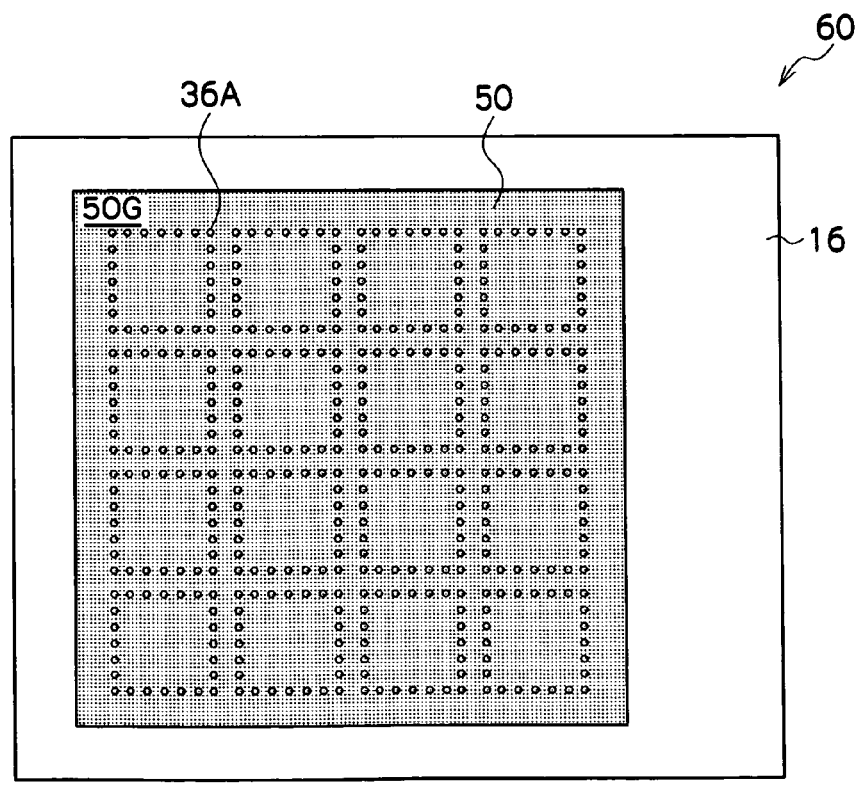
FIG. 6B is a plan view viewing the substrate frame from the surface side, and shows the sealing resin grinding process.

FIGS. 6A and 6B are drawings showing the sealing resin grinding process. FIG. 6A is a partial sectional view of the substrate frame, and FIG. 6B is a plan view viewing the substrate frame from the surface side.

After the surface of the substrate frame 60 is covered by the sealing resin 50M, the sealing resin 50M is ground from the surface side by using a grinding device such as a grinder or the like, until the end surfaces 36A of the other ends of the surface side terminals 36 are exposed. The ground surface 50G, which is the same height as (the same surface as) the end surfaces 36A of the surface side terminals 36, is formed at the surface of the sealing resin 50. The ground surface 50G is parallel to the surface of the core material 16. As a result, as shown in FIG. 6B, the plural end surfaces 36A are exposed at the ground surface 50G of the sealing resin 50.

In order to form a thin sealing resin layer by a conventional transfer method, a high-level mold fabrication technique is required. In contrast, in the present invention, by grinding the molded sealing resin 50M from the surface side, a thin sealing resin layer is formed, and making the double-sided electrode package thin can be realized very easily. Further, the surface of the substrate frame 60 is covered uniformly by the sealing resin 50, except for the end surfaces 36A of the surface side terminals 36. Accordingly, it is difficult for the resin to peel off from the surface of the substrate frame 60, as compared with a case of being covered by plural types of resins that have different coefficients of thermal expansion and coefficients of thermal contraction.
(Rewiring Process)

Next, rewiring is carried out on the ground surface 50G of the sealing resin 50.

Figure 7A:
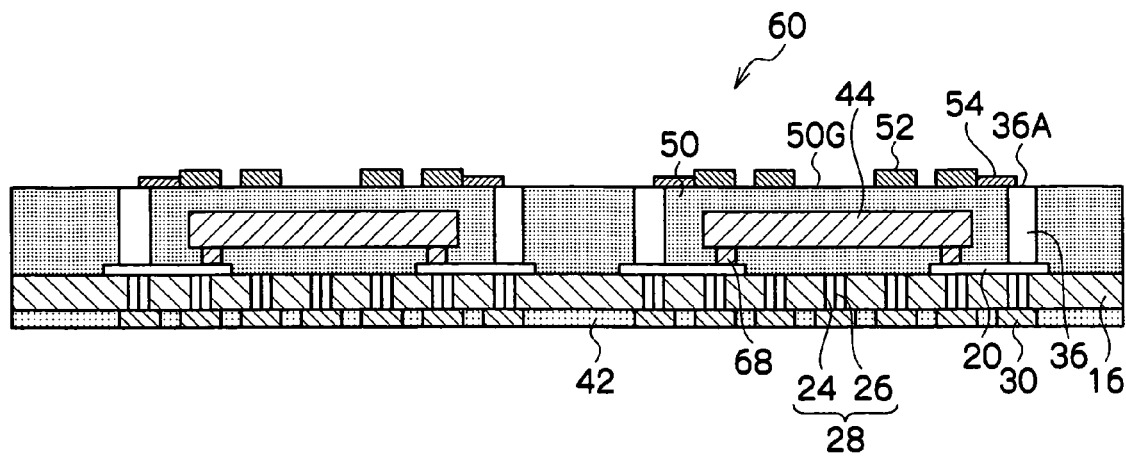
FIG. 7A is a partial sectional view of the substrate frame, and shows a rewiring process.
Figure 7B:
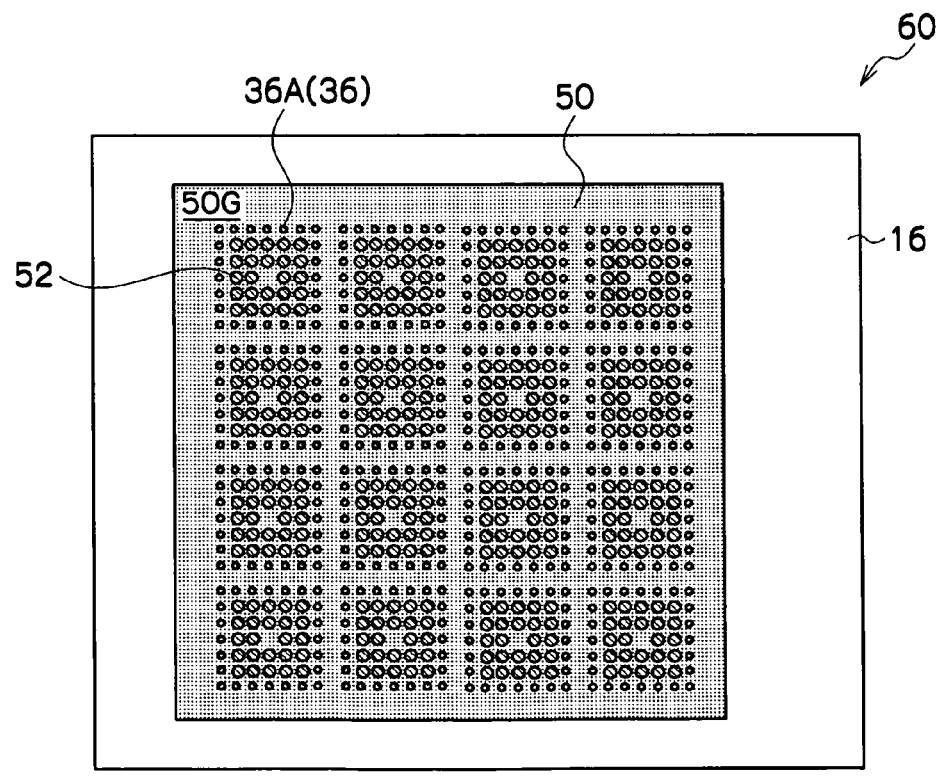
FIG. 7B is a plan view viewing the substrate frame from the surface side, and shows the rewiring process.

FIG. 7A and FIG. 7B are drawings showing the rewiring process. FIG. 7A is a partial sectional view of the substrate frame, and FIG. 7B is a plan view viewing the substrate frame from the surface side.

The rewiring pads 52 and the wires 54 are formed from metal nanoparticles in a predetermined rewiring pattern on the ground surface 50G of the sealing resin 50. In the present exemplary embodiment, because the end surfaces 36A of the surface side terminals 36 and the ground surface 50G are formed at the same height (the same surface), the forming of the rewiring pattern is easy. Further, because the ground surface 50G is a rough surface, the adhesion with the rewiring pads 52 and the wires 54 is excellent.

In the present exemplary embodiment, as shown in FIG. 2B, the 24 surface side terminals 36 are disposed so as to quadrangularly surround one chip placement region 14, such that seven of the end surfaces 36A are lined up at one side. For example, as shown in FIG. 1B, the 24 rewiring pads 52 can be formed on the ground surface 50G per chip placement region 14, in accordance with the number of the end surfaces 36A.

The rewiring pads 52 can be disposed (rewired) in an arbitrary layout on the ground surface 50G so as to facilitate connection with the package layered on the upper side. For example, in the rewiring pattern shown in FIG. 1B, the 24 rewiring pads 52 are arrayed in a 5×5 matrix form except for one at the center. As shown in FIG. 1B, the wires 54 are formed so as to connect the end surfaces 36A and the rewiring pads 52 in a one-to-one correspondence.

The metal nanoparticles are metal particles of a particle diameter of about 1 to 100 nm. Copper nanoparticles for example can be used as the metal nanoparticles. Further, the rewiring pattern can be formed by inkjet printing using an ink containing metal nanoparticles, or by screen printing using a paste containing metal nanoparticles. In the case of using an ink or paste containing metal nanoparticles, the rewiring pattern is formed, and thereafter, reduction using atomic hydrogen is carried out, and contamination and oxides due to organic solvents or the like are removed.
(Dicing Process)

Finally, the substrate frame 60 is diced and the respective packages are individuated.

Figure 8A:
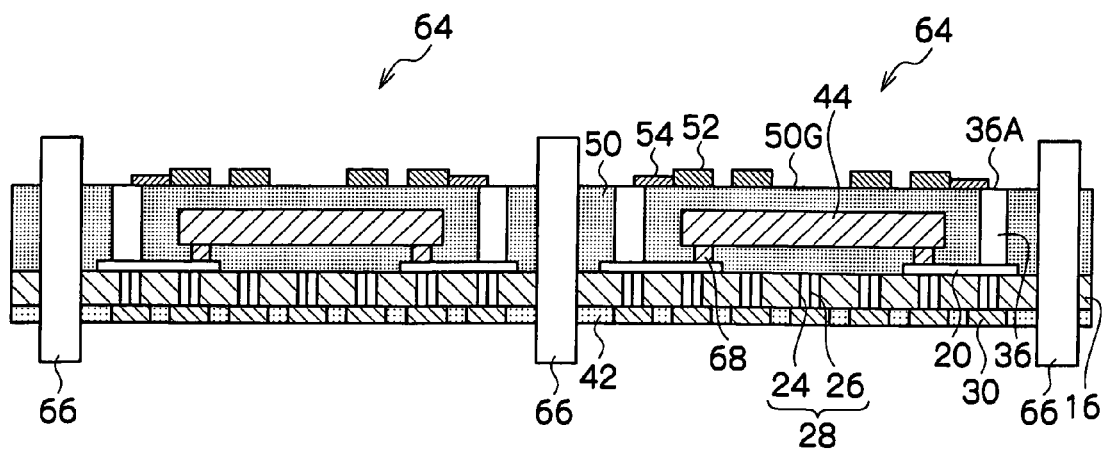
FIG. 8A is a partial sectional view of the substrate frame, and shows a dicing process.
Figure 8B:
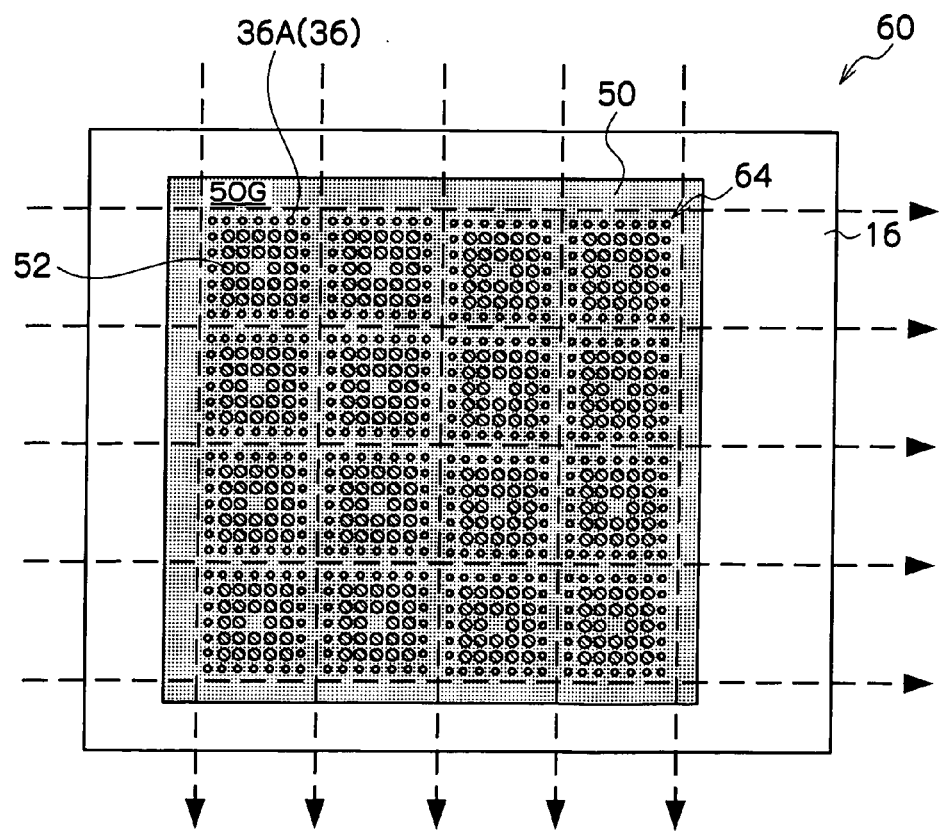
FIG. 8B is a plan view viewing the substrate frame from the surface side, and shows the dicing process.

FIGS. 8A and 8B are drawings showing the dicing process. FIG. 8A is a partial sectional view of the substrate frame, and FIG. 8B is a plan view viewing the substrate frame from the surface side.

Plural package structures 64 are formed on the substrate frame 60. In the present exemplary embodiment, as shown in FIG. 8B, sixteen of the double-sided electrode package structures 64 are disposed in a 4×4 matrix form at the illustrated portion of the substrate frame 60. An unillustrated blade is moved in the directions of the arrows, the substrate frame 60 is saw-cut in the form of a grid, and the respective double-sided electrode packages 64 are individuated. The double-sided electrode packages 10 are thereby completed. Further, the substrate frame 60 at passage regions 66 of the blade is cut-off by saw cutting. A diamond blade or the like can be used as the blade.

As described above, in accordance with the present exemplary embodiment, making the double-sided electrode package thin can be realized very easily by grinding the sealing resin, that mold-seals the semiconductor chip, from the surface side, without the need to ready in advance a substrate frame which is counterbored or the like.

Because the rewiring pads can be disposed (rewired) in an arbitrary layout, connection with the package layered on the upper side is facilitated. Further, because the end surfaces of the surface side terminals and the ground surface are formed at the same height (at the same surface), formation of the rewiring pattern is easy.

The grinding surface is a rough surface, and has excellent adhesion with the rewiring pattern. Therefore, it is difficult for wire breakage due to peeling of the rewiring pattern to occur.

Further, because the surface of the package substrate is covered by one type of resin (the sealing resin), peeling of the resin due to the heat of the reflow (soldering) or the like at the time of substrate mounting can be prevented. Wire breakage, which is due to entry of moisture into the package interior or peeling of the rewiring pattern, can thereby be prevented.

Second Exemplary Embodiment

In the above-described first exemplary embodiment, the rewiring pattern is formed on the surface of the double-sided electrode package. However, in the second exemplary embodiment, bump connecting portions, which are for bump-connection with the package at the upper side, are provided at the surface of the double-sided electrode package. Because the other structures are substantially the same as those of the first exemplary embodiment, the same structural portions are denoted by the same reference numerals, and description thereof is omitted.

(Double-Sided Electrode Package)

Figure 9A:
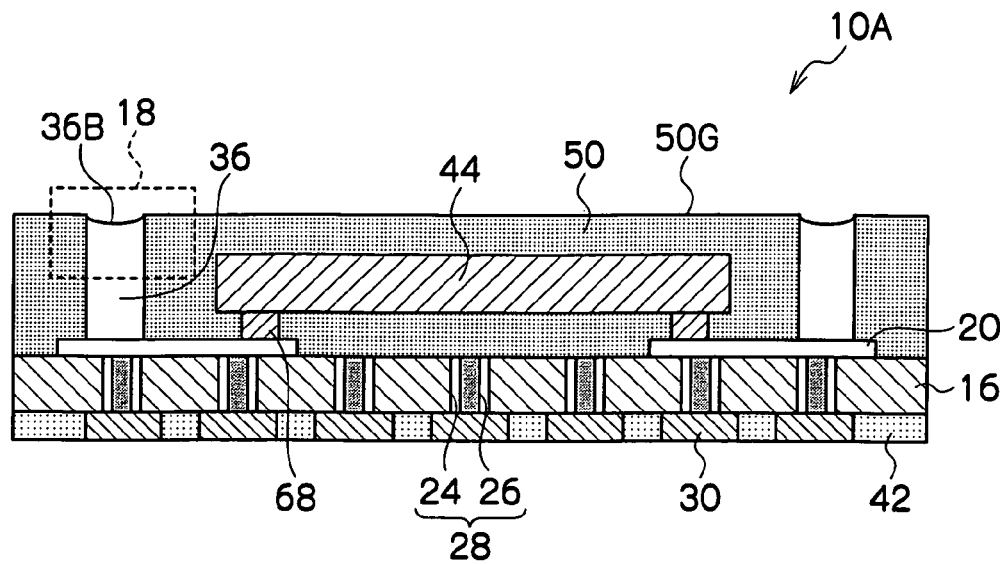
FIG. 9A is a schematic sectional view showing the structure of a double-sided electrode package relating to a second exemplary embodiment of the present invention.
Figure 9B:
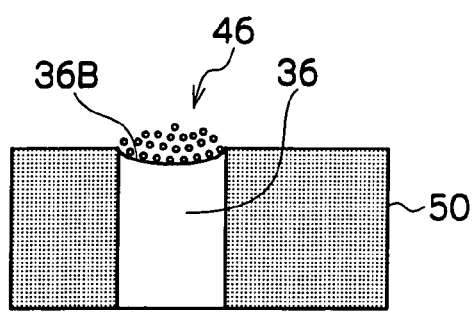
FIG. 9B is a partial enlarged view of the periphery of an end portion (the portion surrounded by the dotted line) of a surface side terminal of the structure of the double-sided electrode package relating to the second exemplary embodiment of the present invention.

FIG. 9A is a schematic sectional view showing the structure of a double-sided electrode package relating to the second exemplary embodiment of the present invention. FIG. 9B is a partial enlarged view of the periphery of an end portion of a surface side terminal (a portion 18 surrounded by the dotted line).

A double-sided electrode package 10A relating to the second exemplary embodiment has the package substrate 12 of substantially the same structure as in the first exemplary embodiment. As described above, the package substrate 12 has the core material 16 at which the wires 20, the through electrodes 28, the electrode pads 30, the surface side terminals 36 and the solder resist 42 are formed. Differently than in the first exemplary embodiment, the end portion of the surface side terminal 36 is an end surface 36B that is formed in a concave shape. Namely, the end surface 36B of the surface side terminal 36 is a concave surface whose center is sunk-in in a convex shape downwardly.

The semiconductor chip 44 is disposed faced down at the chip placement region 14, and is flip-chip connected to the package substrate 12. The semiconductor chip 44 is sealed by the sealing resin 50. Due to the resin layer, which is formed by molding so as to cover the semiconductor chip 44, being ground from the surface, the surface of the sealing resin 50 is made to be the same height as the highest portions of the other ends of the surface side terminals 36. The surface of the sealing resin 50 is the ground surface 50G which is formed by grinding. The ground surface 50G is parallel to the surface of the core material 16. The concavely-formed end surfaces 36B of the surface side terminals 36 are exposed at the ground surface 50G of the sealing resin 50. Therefore, plural concave portions are formed in the ground surface 50G of the sealing resin 50.

As shown in FIG. 9B, a solder paste 46 or the like is held easily at the end surface 36B, which is formed in a concave shape, of the surface side terminal 36, and it is easy to further form a connection terminal on the end surface 36B. For example, a solder paste may be coated on the end surfaces 36B so as to form an LGA (Land Grid Array) type package, or solder balls may be provided on the end surfaces 36B so as to form a BGA (Ball Grid Array) type package.

(Manufacturing Method of Double-Sided Electrode Package)

A method of manufacturing the above-described double-sided electrode package 10A will be described next. The double-sided electrode package 10A relating to the second exemplary embodiment can be fabricated in the same way as the first exemplary embodiment, except that the end surfaces 36A are processed into concave shapes so as to form the end surfaces 36B. Therefore, description of the processes up to and including the sealing process will be omitted.

(Sealing Resin Grinding Process)

In the same way as in FIGS. 6A and 6B, after the surface of the substrate frame 60 is covered by the sealing resin 50M, the sealing resin 50M is ground from the surface side by using a grinding device such as a grinder or the like, until the end surfaces 36A of the other ends of the surface side terminals 36 are exposed. The ground surface 50G, which is the same height (the same surface) as the end surfaces 36A of the surface side terminals 36, is formed at the surface of the sealing resin 50. As shown in FIG. 6B, the plural end surfaces 36A are exposed at the ground surface 50G of the sealing resin 50.

(Concave Portion Forming Process)

Next, the end surfaces 36A of the surface side terminals 36 are processed into concave shapes.

As shown in FIG. 6B, the plural end surfaces 36A are exposed at the ground surface 50G of the sealing resin 50. By etching them from the surface side, the end surfaces 36A are processed into concave shapes. In this way, the concave end surfaces 36B are formed.

(Dicing Process)

Finally, the substrate frame 60 is diced and the respective packages are individuated. The double-sided electrode packages 10A are thereby completed.

As described above, in accordance with the present exemplary embodiment, making the double-sided electrode package thin can be realized very easily by grinding the sealing resin, that mold-seals the semiconductor chip, from the surface side, without the need to ready in advance a substrate frame which is counterbored or the like.

Further, the solder paste or the like is easily held at the end surfaces, that are formed in concave shapes, of the surface side terminals. Connection terminals such as solder balls or the like can further be formed easily on the end surfaces.

Moreover, because the surface of the package substrate is covered by one type of resin (the sealing resin), peeling of the resin due to the heat of the reflow (solder) or the like at the time of substrate mounting can be prevented.

Third Exemplary Embodiment

An example of a POP module, in which two double-sided electrode packages are layered and mounted on a mother board, is illustrated as a third exemplary embodiment. The structures of the double-sided electrode packages and the like are the same as in the first and second exemplary embodiment, and therefore, the same structural portions are denoted by the same reference numerals and description thereof is omitted.

(POP Module)

Figure 10:
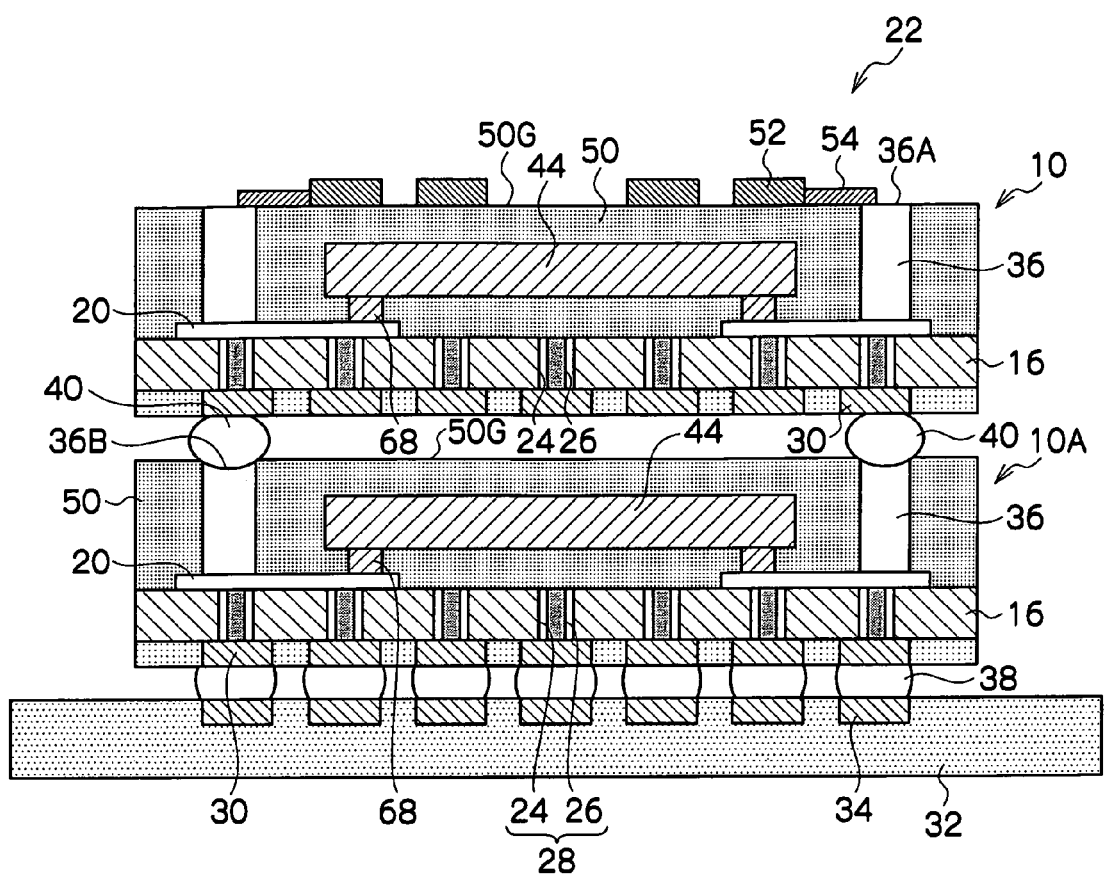
FIG. 10 is a schematic sectional view showing the structure of a POP module relating to a third exemplary embodiment of the present invention.

FIG. 10 is a schematic sectional view showing the structure of a POP module relating to the third exemplary embodiment of the present invention. A POP module 22 relating to the third exemplary embodiment is structured by a mother board 32, the double-sided electrode package 10A and the double-sided electrode package 10.

Plural connection pads 34 are formed on the surface of the mother board 32. The double-sided electrode package 10A is layered on the mother board 32. The electrode pads 30 of the reverse side of the double-sided electrode package 10A are electrically connected, via solder balls 38, to the connection pads 34 of the surface of the mother board 32. The other double-sided electrode package 10 is layered on the double-sided electrode package 10A. The end surfaces 36B, which are formed in concave shapes, of the surface side terminals 36 are exposed at the surface of the electrode package 10A. The electrode pads 30 of the reverse side of the double-sided electrode package 10 are electrically connected, via solder balls 40, to the end surfaces 36B that are exposed at the surface of the double-sided electrode package 10A.

(Package Layering Process)

The solder balls 38 are welded to the electrode pads 30 of the reverse side of the double-sided electrode package 10A. Further, solder paste (not shown) is coated on the end surfaces 36B that are exposed at the surface of the double-sided electrode package 10A, and the solder balls 40 are welded via this solder paste. The solder balls 38, 40 are formed as external terminals at the double-sided electrode package 10A. The solder balls 38 of the double-sided electrode package 10A press-contact the connection pads 34 of the surface of the mother board 32, and the solder balls 40 press-contact the electrode pads 30 of the reverse side of the double-sided electrode package 10. In this way, the double-sided electrode package 10A and the double-sided electrode package 10 are mounted on the mother board 32, and the POP module 22 is completed.

As described above, in accordance with the present exemplary embodiment, because the end surfaces 36B of the surface side terminals 36 are formed in concave shapes, they hold solder paste easily, and it is easy to form solder balls (connection terminals) via the solder paste. Accordingly, the connectability with other packages improves, and POP mounting of the double-sided electrode package is facilitated.

Modified Examples

Modified examples will be described hereinafter.

The above first exemplary embodiment describes an example in which the rewiring pads are formed on the surface of the double-sided electrode package, and the electrode pads are formed on the reverse of the double-sided electrode package. However, connection terminals can further be formed on these pads. For example, a solder paste may be coated on the pads so as to form an LGA (Land Grid Array) type package, or solder balls may be provided on the pads so as to form a BGA (Ball Grid Array) type array.

The above third exemplary embodiment describes an example in which solder balls are provided on the electrode pads of the double-sided electrode package, so as to form a BGA type package. However, solder paste can be coated on the electrode pads and an LGA type package formed. In an LGA type package, solder bumps are formed as external terminals by screen printing of solder paste, and the package can be made to be more thin.

In the above first through third embodiments, examples are described in which the package substrate is structured by a flat-plate-shaped core material formed by an insulator, and wires, through electrodes, electrode pads, surface side terminals, and a solder resist. However, the package substrate can be structured by a multilayer organic substrate in which wires are formed at the multiple layers. A multilayer organic substrate is a substrate in which wiring patterns are formed at each of respective layers of a resin substrate formed from plural layers (e.g., two to four layers), and via holes for connecting the wiring patterns of the respective layers are formed as needed. Conductor layers are formed at the interiors of the via holes, and these conductor layers are connected to lands which are end surface electrode portions formed at the bottom surface side.

Further, the above first through third exemplary embodiments describe examples in which one semiconductor chip is placed per one double-sided electrode package. However, plural semiconductor chips can be placed at a single double-sided electrode package.

In the above first through third exemplary embodiments, the semiconductor chips are flip-chip connected, but the semiconductor chips may be wire-bonding connected by using metal wires.

Further, a solder resist at the surface of the double-sided electrode package is omitted in the above-described first through third exemplary embodiments. However, the surface of the double-sided electrode package can be covered by a solder resist.

Although the shapes of the surface side terminals are solid cylindrical in the above-described first through third embodiments, surface side terminals which are shaped as prisms can be used. The outer peripheral configuration of the cut section when cutting a columnar surface side terminal in a plane parallel to the substrate (core material) surface may be round such as a circle, an oval, an ellipse or the like, or may be a polygon such as a quadrangle (square, rectangle, parallelogram, rhombus), pentagon, hexagon, heptagon, octagon, or the like.

What is claimed is:

1. A semiconductor device that includes a double-sided electrode package and a semiconductor chip having a plurality of electrodes, the semiconductor device comprising:
    a package substrate comprised of a core material that is an insulator and that is provided with a plurality of through electrodes each extending from a first surface to a second surface of the core material, the semiconductor chip being placed on said first surface of the package substrate;
    a plurality of electrode pads that are comprised of wires formed on said first surface of the package substrate in direct contact with respective through electrodes of the plurality of electrodes and that are electrically connected to respective ones of the plurality of electrodes of the semiconductor chip;
    a plurality of external electrode pads for external connection that are formed on said second surface of the package substrate in direct contact with respective through electrodes of the plurality of through electrodes and that are electrically connected to respective ones of the plurality of electrode pads via respective ones of the through electrodes, the plurality of external electrode pads and the package substrate extending in the same plane and forming a flat external surface;
    a sealing resin layer having a ground surface that is a rough surface and that is parallel to said first surface of the package substrate, the sealing resin layer comprising a sealing resin such that the semiconductor chip is sealed with the sealing resin;
    a surface side terminal that is columnar and is formed so as to pass through the sealing resin layer, one end of the surface side terminal being electrically connected to the electrode pad, and another end of the surface side terminal being exposed at said ground surface of the sealing resin layer, said ground surface of the sealing resin layer having a height that is the same as that of said another end surface of the surface side terminal; and
    connection wire formed on the ground surface of the sealing resin layer.

2. The semiconductor device of claim 1, further comprising a rewiring pad formed on the ground surface of the sealing resin layer,
    wherein said connection wire is electrically connected to said another end of the surface side terminal and the rewiring pad.

3. The semiconductor device of claim 1, wherein a concave portion is formed at said another end of the surface side terminal.

* * * * *